United States Patent [19]

Haq

[11] Patent Number: 4,973,865
[45] Date of Patent: Nov. 27, 1990

[54] AUTO-DELAY GAIN CIRCUIT
[75] Inventor: Ejaz U. Haq, Sunnyvale, Calif.
[73] Assignee: VLSI Technology, Inc., San Jose, Calif.
[21] Appl. No.: 456,879
[22] Filed: Dec. 20, 1989
[51] Int. Cl.$^5$ .......................... H03K 5/13; H03K 17/16
[52] U.S. Cl. ..................................... 307/603; 307/443; 307/493; 307/542; 307/601
[58] Field of Search ................ 307/443, 595, 480, 591, 307/269, 473, 475, 493, 601, 603, 605, 608, 542, 270, 290, 593; 328/55

[56] References Cited

U.S. PATENT DOCUMENTS

| | | | |
|---|---|---|---|
| 4,063,117 | 12/1977 | Laugesen et al. | 307/473 |
| 4,271,366 | 6/1981 | Isayama et al. | 307/591 |
| 4,529,895 | 7/1985 | Garverick et al. | 307/473 |
| 4,570,912 | 2/1986 | Yasuda et al. | 307/473 |
| 4,717,835 | 1/1988 | Takeuchi | 307/269 |
| 4,760,283 | 7/1988 | Weaver | 307/443 |
| 4,772,812 | 9/1988 | Desmarais | 307/473 |
| 4,782,252 | 11/1988 | Levy et al. | 307/573 |
| 4,880,997 | 11/1989 | Steele | 307/473 |

Primary Examiner—Stanley D. Miller
Assistant Examiner—Ganh Nguyen
Attorney, Agent, or Firm—Clifton L. Anderson

[57] ABSTRACT

A multi-stage output buffer provides for inactivation and then delayed reactivation of a second gain stage after a data transition. The delay imposed is a function of the output voltage, which is fed back through a threshold detector. A transition detector is coupled to data inputs so that it can inactivate the second gain stage upon a data transition; the transition detector is coupled to the threshold detector so that it can activate the second gain stage once the output voltage crosses a predetermined threshold voltage. This configuration imposes relatively long delays on second gain stage activation when large loads are applied to keep switching transients at tolerable levels. When lesser loads are applied, a shorter delay permits more rapid throughput.

9 Claims, 2 Drawing Sheets

AUTO-DELAY GAIN CIRCUIT

BACKGROUND OF THE INVENTION

The present invention relates to digital electrical circuits and, more particularly, to multi-stage buffers, for example, as used for integrated output circuits. A major objective of the present invention is to provide an integrated circuit output buffer which limits output switching noise when heavy output loads are connected, while optimizing throughput under light-load conditions.

Much of modern technological progress is identified with the development of integrated circuits, which provide high levels of functionality in a small space and require relatively small amounts of power. Most of these integrated circuits contain a large number of transistor switches which cause voltage fluctuations between high and low voltage levels which can represent alternate logic levels. A very large scale integration (VLSI) circuit can contain millions of such switching transistors.

One of the problems an integrated circuit designer must consider is noise. Each time a transistor turns on or off, transients are introduced in the signal and power lines associated with that transistor. A transient introduced into the power and ground lines affects other transistors coupled to the same power and ground lines. Where the affect is strong enough, the transients can introduce errors in data signals and even damage circuit components.

In particular, large current transients can be introduced by output buffers drive very large current or capacitive loads. In some cases, e.g., a read/write contention, an external device can drive an output buffer to the polarity opposite required by the data the buffer is driving, generating very high currents. High currents can also be generated when the output is shorted to a power source ($V_{cc}$, $V_{ss}$).

The deleterious affects of transients can be minimized by ensuring that sufficient current-carrying capacity is available in the power and ground lines and by adjusting the timing of circuit components to preclude multiple simultaneous switching which would exceed the capacity of associated power and ground lines. For most of the transistors in an integrated circuit, this design task is relatively straightforward since the power requirements are small and the loads imposed by neighboring circuit elements are predeterminable.

The design problem is more serious for the circuit components, like output buffers, which interface more or less directly to electrical components off the integrated circuit. The power requirements for interface components are usually much higher than for internal components because longer signal distances are involved. Furthermore, due to the wide applicability of many types of integrated circuits, e.g., microprocessors and memory components, a wide range of interfacing components or loads must be provided for. In addition, since it is never certain that an incorporating system will operate as intended, these components should be able to withstand at least some "prohibited conditions", such as a read/write contention.

Typically, integrated circuits incorporate output buffers designed to accommodate the higher and more uncertain load requirements for interface components. Output buffers use large current sources to overcome large and non-predetermined loads. Since output buffers switch large currents on and off, they introduce relatively large transients in the incorporating integrated circuit. Some integrated circuits use time-staggered output buffers to limit the number of transients occurring at any given moment. While staggering can minimize the effect of cumulative transients, individual transients can be quite substantial.

U.S. Pat. No. 4,782,252 to Levy et al. discloses a buffer with a variable resistive device for limiting the transients introduced by turning on a buffer transistor. Alternatively, a delay can be introduced between activations of successive stages of an multi-stage buffer so that transient power is distributed over time.

The foregoing approaches to avoiding buffer transients involve a compromise. Longer delays improve transient handling but impair device throughput. If a long delay is selected for managing transients where large maximum loads are anticipated, throughput will be unnecessarily slow when the device is incorporated in a system imposing small loads but requiring high speed. If short delays are selected, a large load can induce a transient that would result in an error or circuit damage.

Moreover, while the forgoing staggered transition approaches buffer the transition to data, they do not buffer the return to the high-impedance state. Normally, a high-impedance state is provided between successive read events. Thus, noise is generated every read cycle upon the return to the high-impedance state, even though the transition to data is buffered.

What is needed is a buffer which can minimize transients while providing higher speeds when lower external loads are to be driven. In addition, buffering is required for both the transition to data and the transition to the high-impedance state.

SUMMARY OF THE INVENTION

In accordance with the present invention, a multi-stage gain circuit uses feedback to delay activation of a gain stage as a function of the load on the gain circuit. More specifically, this gain stage is inactivated in response to a transition in a data signal and reactivated when the output crosses a predetermined threshold. Typically, this threshold is a voltage between a voltage representing a logic low and a voltage representing a logic high.

The time required for the threshold to be crossed is positively correlated with the magnitude of the load on the circuit output. Therefore, when a large load is applied, a longer delay is imposed. This longer delay mitigates the larger total current transition required by the larger load. When a smaller load is applied, a smaller total current transition is required and a shorter delay is required to spread the concomitant transients to maintain noise within a tolerable level. The multi-stage gain circuit implements this shorter delay since the threshold is attained more quickly than with a large load. As a result, data throughput is optimized for a range of load levels.

A gain circuit in accordance with the present invention includes a data signal input, an output, first and second gain stages, a threshold detector coupled to the output, and a transition detector coupled to the input of the first gain stage and the output of the gain circuit. The transition detector detects transitions in the data signal and the output of the threshold detector and deactivates and reactivates the second gain stage, via a control input thereof, in response to detected transitions. The method of the present invention involves receiving the data stream, amplifying it using the first gain stage, deactivating the second gain stage in response to a transition in the data steam, and reactivating the second gain stage in response to a threshold detection.

A tri-state data (high-impedance signal can be handled using complementary inputs, complementary control inputs of the second gain stage, and complementary data signal inputs for said transition detector. This complementary architecture allows transitions to and from a "no-data" or "high-impedance" state to be distinguished from transitions between data values. When this complementary architecture is used, the transitions to the high-impedance state are buffered as well as the transitions to data.

The dependance of delay on output load can be adjusted by setting the threshold. By building in different thresholds for the threshold detectors of different gain circuits, time-staggering can be implemented. This is useful for minimizing the accumulation of transients when multiple output buffers are used. Thresholds can be varied using different dimensions and/or doping for selected threshold component features. Alternatively, the threshold detector can include a comparator which permits threshold level to be adjusted as required. The threshold can have one value for positive transitions and another for negative transitions, or a common value can be used for transitions in either direction.

While monitoring the delay between data signal transitions and thresholded output transitions is used to control transients, other purposes can be served. For example, the transition detector can provide a time-out indication when the threshold is not achieved within a prescribed time. This time-out can be used to shut down a system, provide a warning indication, or institute an exception routine. For example, the time-out can be taken to indicated that the external system is attempting to write to internal memory. In this case, a read operation can be terminated and write enabled.

Accordingly, an output buffer is provided which provides greater throughput when lesser loads are applied and greater transient protection when greater loads are applied. Buffering is provided for both transitions to high-impedance states and to data. In addition, tri-state inputs and exception conditions are provided for. These and other features and advantages of the present invention are apparent from the description below with reference to the following drawings.

DESCRIPTION OF THE PREFERRED EMBODIMENTS

Figure 1:
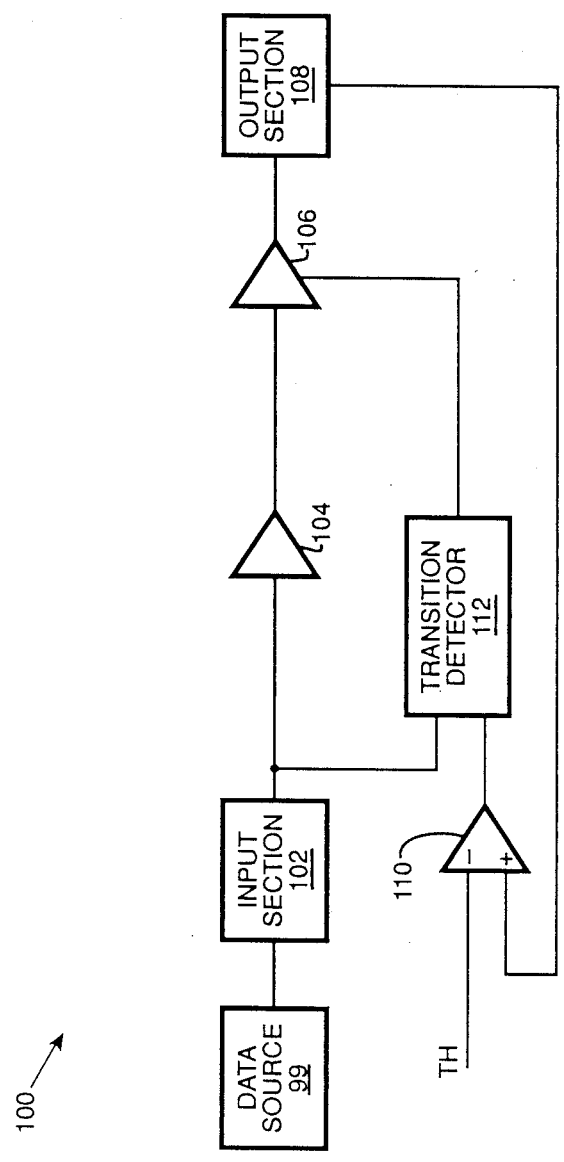
FIG. 1 is a block diagram of an output buffer in accordance with the present invention.

In accordance with the present invention, a two-stage output buffer 100 comprises an input section 102, a first gain stage 104, a second gain stage 106, an output section 108, a threshold detector 110, and a transition detector 112, as shown in FIG. 1. Buffer 100 receives complementary inputs from a data source 99, and serves as its interface with external circuitry. Buffer 100 and data source 99 are components of a common integrated circuit. Output section 108 includes an output pad which can be coupled to packaging components used to interface the integrated circuit to other components of an incorporating system.

Input section 102 receives a stream of data from data source 99. The output of input section 102 is amplified by first gain stage 104. Second gains stage 106, when activated, provides further amplification. The voltage at output section 108 is fed back to one input of threshold detector 110, which functions as a comparator arranged to receive a constant threshold level signal TH at its other input. Threshold detector 110 provides a logic high output when the voltage at output section 108 is above the level of threshold signal TH and a logic low when the voltage at output section 108 is below the level of threshold signal TH. The output of threshold detector 110 is provided to transition detector 112.

Transition detector 112 is also coupled to input section 102 so that it can detect transitions in the data stream. The data stream at this point is buffered from output section by first gain stage 104. In response to a detected transition in the data stream, transition detector 112 transmits a control signal to maintain second gain stage 106 in an inactive state. With second gain stage 102 in this inactive state, the output of first gain stage 104 is shorted to output section 108.

Output buffer 100 is designed so that a transition in the data stream will cause a change in the voltage at output section 108. Inevitably, the output voltage change lags behind the data transition. This lag is generally smaller when the current capacity of first gain stage 104 is large. For a given first stage current capacity, the lag is longer for a greater load. The time required for a changing output voltage to reach a predetermined threshold correlates with this lag. Thus, the load magnitude correlates with the duration between a data signal transition and a corresponding threshold detection by threshold detector 110.

Transition detector 112 provides a control signal to second gain stage 106, which is thereby deactivated when a data signal transition is detected and reactivated when a threshold transition is detected. The delay between a data signal transition and second gain stage reactivation thus correlates with output load. The delay also depends on the threshold value of signal TH input to threshold detector 110. By applying different threshold values to different output buffers, time-staggering can be applied to avert accumulation of transients associated with different buffers.

Transition detector 112 can also provide a time-out signal TO. For example, a clock and a counter can be incorporated in threshold detector 112 to implement this function, This time-out signal TO can be used to flag an error or initiate an exception routine. For example, in an system using common input/output ports, write and read operations might be applied concurrently to a memory cell. Time-out signal TO can be taken to indicate that a write is occurring during a read operation. Time-out TO signal can trigger the termination of the read operation so that the write operation can be completed.

Figure 2:
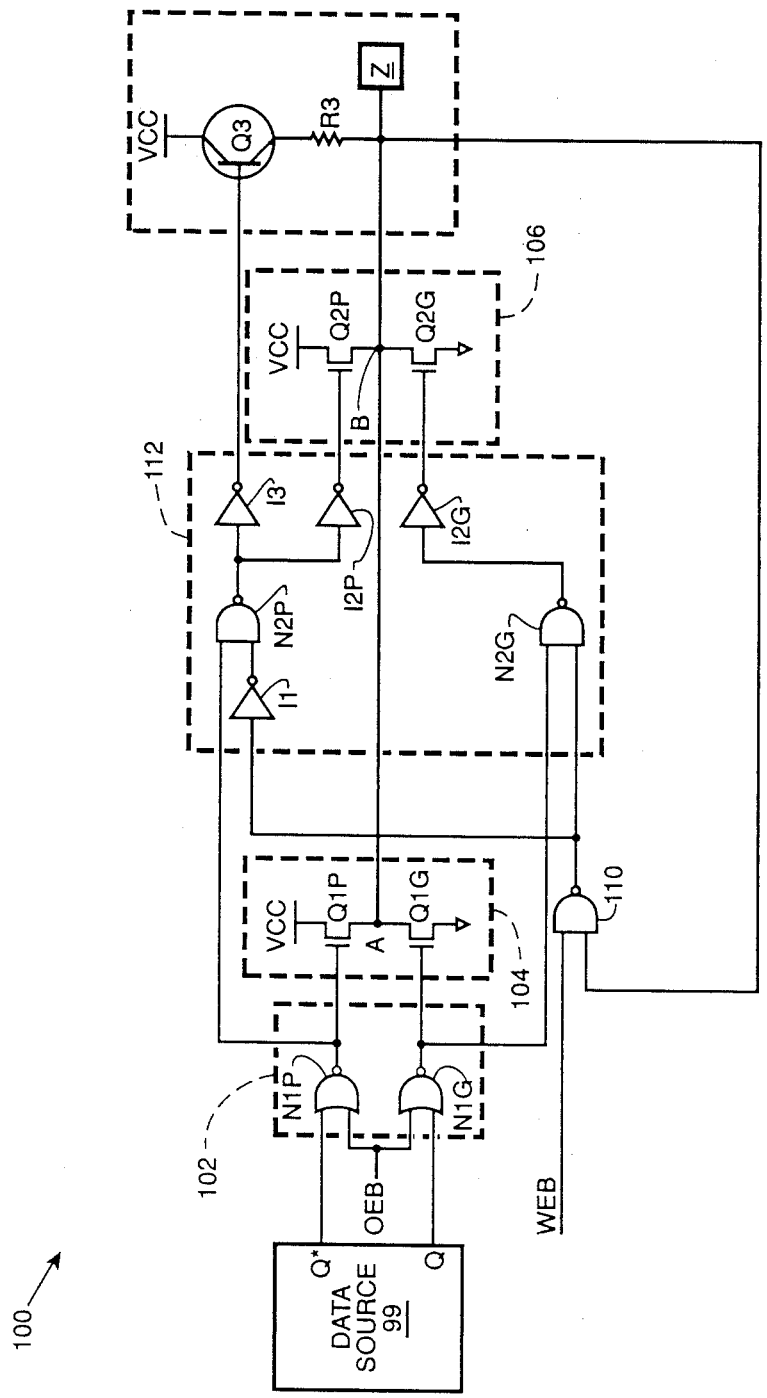
FIG. 2 is a schematic of the output buffer of FIG. 1.

As shown in FIG. 2, data source 99 provides complementary data signals complementary outputs Q and Q* to input section 102 so that a high-impedance, no-data, state (Q=1,Q*=1) can be distinguished from data levels (1,0) and (0,1). Input section 102 includes two NOR gates N1P and N1G, one for each data line. A common, active-low, output enable signal OE can be applied to the NOR-gate inputs not receiving data signals.

First gain stage 104 is conventional, including one MOS transistor Q1P between its output node A and a power line VCC and another MOS transistor Q1G between node A and ground. When OEB is low, primary output Q is applied indirectly to the gate of transistor Q1G, and the complementary output from Q* is applied indirectly to the gate of transistor Q1G. When OE is high, both transistors Q1P and Q1G are off, so that node A is maintained in a high-impedance state. Since output section is sorted to node A, output section is in a high-impedance state when OE is high. Otherwise, output section tracks the primary data value.

Second gain stage 106 is similar to first gain stage 104 and comprises MOS transistor Q2P between its output node B and power and transistor Q2G between output node B and ground. In this case, transistors Q2P and Q2G are controlled by feedback, as detailed below. Output node B is shorted to output section 108.

Output section 108 includes an output pad Z, an NPN bi-polar pull-up transistor Q3 and an associated pull-up resistor R3 in parallel with Q2P. As with second gain stage 106, bipolar transistor Q3 is control by feedback from output section 108.

The voltage at pad Z is fed back to threshold detector 110. In FIG. 2, threshold detector 110 is depicted as a NAND gate which has an active-low, write-enable signal WEB at the input not used for feedback of the buffer output. When active, write-enable signal WEB switches off second gain stage 106 and pull-up transistor Q3 and is usually used when output enable OEB is active so its voltage is high, disabling first gain stage.

When the write-enable signal WEB is inactive, threshold detector 110 functions as an inverter which is operated in its linear region, i.e., transforms an analog feedback signal to a binary output signal. Through careful process control, the threshold analog level leading to a change in binary output level can be predetermined, as is known in the art. Where ground is zero volts and power is 5 volts, this threshold can be set at about 1.5 volts.

Transition detector 112 comprises two NAND gates N2P and N2G along with several inverters I1, I2P, I2G and I3, which provide the proper sign for control signals to second gain stage 106 and pull-up transistor Q3. NAND gate N2G is connected to the primary output of input section so as to detection transitions in the primary data signal from output Q. NAND gate N2P is connected to the complementary output of input section 102 so as to detection transitions in the complementary data signal from output Q*. Both NAND gates N2P and N2G are coupled to the output of threshold detector 110 to receive threshold transition detections therefrom. The operation of transition detector 112 is described by example below.

Data source 99 includes memory cells and double-ended sense amplifiers which are pre-charged high to provide a data stream, including signals from outputs Q and Q*, representing (primary data level, complementary data level): logic high (1,0) logic low (0,1) and no data (1,1). The state value (0,0) is prohibited. The operation of buffer 100 is described below in the context of the a pair of read operations, first a logic 1 is read and then a logic 0 is read. More specifically, the sequence is high-impedance state (1,1), a data high (1,0), a high-impedance state (0,1), a data low (0,1), and a high-impedance state (1,1).

In the initial high-impedance state (1,1)Q*=1,N1P is low so that Q1P is off, and N2P is high so that I2P is low and Q2P is off. In this state Q=1,N1G is low so that Q1G is off, and N2G is high so that I2G is low and Q2G is off. Since all four transistors Q1P, Q1G, Q2P and Q2G are off, output Z is in the high-impedance state with respect to buffer 100. Thus, the voltage at Z is dependant on the load, which in turn affects the transition to data.

The transition to a logic high involves Q remaining high, while Q* goes low; i.e., (1,1)→(1,0). During a read operation, WEB is high and OEB is low. When Q*→0,N1P goes high and Q1P turns on. Thus, first gain stage 104 is activated "immediately", i.e., only the N1P turns on. Thus, first involved. Activation of second gain stage 106 is dependant on the voltage at Z as determined by the load.

If Z is high before the (1,1)→(1,0) transition, threshold detector 110 is low and I1 is high. When N1P goes high, N2P goes low, I2P goes high and Q2P turns on quickly. "Quickly" means than, while there are gate delays, there is no wait for a threshold to be crossed at threshold detector 110. At this point, the quick transition to be logic high state is completed.

If Z is low before the (1,1)→(1,0) transition, threshold detector 110 is high initially and stays high until the Q1P is on long enough to drive Z above its threshold. The time for the threshold to be crossed is dependant on the size of the load on Z. The larger the load, the longer it takes for the threshold to be crossed. Once the threshold is crossed, threshold detector 110 goes low, I1 goes high, N2P goes high, I2P goes low and Q2P turns on, completing the staggered transition in a time positively correlated with the magnitude of the load at Z.

The next read cycle begins with a transition back to the high impedance state. The (1,0)→(1,1) transition causes N1P to go low and Q1P turns off immediately, while Q2P remains on during the gate delays involved in N2P going high and I2P going low. Thus, the return to the high-impedance state is staggered by two gate delays.

The transition to Q=0, i.e., the (1,1)→(0.1) transition, begins with N1G going high so that Q1G turns on immediately. Once again, the course of the transition depends on the voltage at Z. If Z is low before the (1,1)→(0,1) transition, threshold detector 110 is high, N2G is low, and I2G is high so that Q2G turns on quickly.

If Z is high before the (1,1)→(0,1) transition, threshold detector 110 is low so that N2G remains high and I2G remains low so that Q2G remains off until the voltage at Z crosses the threshold of detector 110. Once the threshold is crossed, threshold detector 110 goes high, N2G goes low, I2G goes high and Q2G turns on. The switching of Q1G and Q2G is staggered according to the load on Z.

The return to the high-impedance state involves the transition (0,1)→(1,1). In this case, N1G goes low, turning off Q1G immediately. Then N2G goes high, then I2G goes low, turning off Q2G. The turn off is staggered by two gate delays.

If pad Z is shorted to ground, threshold detector 110 would stay high, inverter I1 would be low, NAND gate N2P would be high, inverter I2P would be low, and Q2P would remain off. Thus, there is no current path from $V_{cc}$ to ground.

If the capacitive load on pad Z is greater than output buffer 100 was designed for, then the delay in the activation of second gain stage 106 increases due to slower rise time of the voltage at pad Z. Hence, current spikes remain within design constraints even for higher capacitive loads, since transistor Q2P is activated only after output pad Z attains its threshold. In other words, the $V_{GS}$ and $V_{DS}$ of transistor Q2P is the same as in the normal case.

Transistors Q1P and Q1G are designed to handle a fraction, e.g., one third to one half, of the total current required for driving output pad Z at the desired level. Transistors Q2P and Q2G can have similar current handling ability. Output pad Z swings between ground plus the voltage rise $V_T$ across MOS transistors Q1G and Q2G, about 0V+1V=1V, and VCC minus the voltage drop $V_{BE}$ across bipolar transistor Q3, about 5V–0.5V=4.5V. The threshold voltage can be set between about 2.5V and 3V. Different buffers can have different thresholds to ensure time-staggering.

Device dimensions should be carefully selected to provide the desired current handling and thresholds. The following nominal values applied to buffer 100 to achieve a 4 milliamp (mA) source current required for a transistor-transistor logic (TTL) $V_{OH}$ level.
10/1.2 P of threshold detector NAND gate
40/1.2 N of threshold detector NAND gate
60/20 NOR gate N1G
100/20 NOR gate N1P
10/45 NAND gate N2G
20/12 NAND gate N1G
15/35 inverter I1
50/50 inverter I2G
30/30 inverter I2P
30/30 inverter I3
375/3 transistor Q1P
375/3 transistor Q2P
275/3 transistor Q2G
108Ω resistor R3

The values are in microns unless other wise indicated. The 750/3 total for Q1P and Q2P is for a high voltage $V_{OH}$ of at least 2.4 where $V_{CC}$=4V. The 550/3 total for Q1G and Q2G is for low voltage VOL of at most 0.4V for $V_G$=0V at 8 mA output sink current.

From the foregoing analysis, it is apparent that output buffer 100 provides the appropriate tri-state logic levels at output Z for each permitted input. Moreover, buffer 100 provides delayed second stage gains where required to avoid large transients. Furthermore, where large transients are not a problem, e.g., where small loads are imposed, this delay is kept minimal for enhanced throughput. Where a data transition is to a level already established at the output by an external load, at most negligible delay is imposed on the second gain stage.

While the invention has been described in the context of a preferred buffer system, those skilled in the art can recognize that many alternative embodiments are readily provided. As indicated, the threshold detector can be in the form of a logic gate or an alternative comparator. The threshold can be fixed during manufacture or a threshold input can be provided to allow the threshold to be set, and even varied, after manufacture. When multiple buffers are used, the thresholds can be staggered so that transients are phase staggered. A threshold can be unitary, i.e., have the same voltage value for positive and negative going voltage transitions. Alternatively, the threshold can be dual, i.e., have a positive-going value and a negative-going value. While the preferred embodiments illustrate the control of current-switching transients using voltage feedback, other parameter pairs can be used including using feedback from a current output to control voltage transients. These and other variations upon and modifications to the disclosed embodiments are provided for by the present invention, the scope of which is limited only by the following claims.

What is claimed is:

1. A gain circuit comprising:
   input means for receiving a data signal;
   a first gain stage for amplifying said data signal, said first gain stage being coupled to said input means for receiving said data signal therefrom;
   a second gain stage for amplifying said data signal as amplified by said first gain state, said second gain stage being coupled to said first gain stage for receiving said data signal as amplified by said first gain stage, said second gain stage including second stage control input means for receiving a first control signal so that said second gain stage can be activated and inactivated;
   an output connectable to an external load, said output being coupled to said second gain stage so that when said second gain stage is active said output receives said data signal as amplified by said first gain stage and said second gain stage and so that when said second gain stage is inactivated said output receives said data signal as amplified by said first gain stage without further amplification by said second gain stage;
   a threshold detector for providing a threshold indication signal as a function of the voltage at said output, said threshold detector being coupled to said output so as to be responsive to the voltage thereat; and
   a transition detector for providing said control signal as a function of said threshold indication signal and said data signal, said transition detector being coupled to said input means for detecting a transition in said data signal, said control signal inactivating said second gain stage in response to a detected data signal transition, said transition detector being coupled to said threshold means for detecting a transition in said threshold indication signal, said control signal activating said second gain stage in response to a detected transition in said threshold indication signal;
   whereby, a delay is introduced between a transition in said data signal and activation of said second gain stage, said delay being a function of the load on said output.

2. The circuit of claim 1 wherein said load-related parameter is voltage.

3. The circuit of claim 1 wherein said transition detector provides a time-out signal when a predetermined durational threshold is exceeded between a transition in said data signal and a transition in said threshold indication signal, whereby said time-out signal can be used to flag an exception condition.

4. The circuit of claim 1 wherein:
   said input means includes a first input line and a second input line, said data signal having a primary form communicated along said first input line and a complementary form communicated along said second input line, said primary form and said complementary form having different values when data is being transmitted and the same value when data is not being transmitted.

5. The circuit of claim 4 wherein said control input means provides for reception of a second control signal, each of said first control signal and said second control signal being able to acquire an active status and an inactive status, said second gain stage being active only when both said first control signal and said second control signal have said active status.

6. The circuit of claim 5 wherein said transition detector includes a first transition detector input and a second transition detector input, said first transition detector input being coupled to said first input line so as to be able to detect transitions in said primary form, said second transition detector input being coupled to said second input line so as to be able to detect transitions in said complementary form, said transition detector being coupled to said control input means so that said second gain stage can be inactivated by assigning an inactive status to said first control signal in response to a transition in said primary form or by assigning an inactive status to said second control signal in response to said complementary form.

7. The circuit of claim 6 wherein said threshold detector is a comparator.

8. The circuit of claim 7 wherein said comparator has an input for receiving a threshold setting input so that the delay function of said circuit can be adjusted.

9. A method comprising:
receiving a data stream;
amplifying said data stream using a first gain stage;
setting a second gain stage to inactive status upon a transition in said data stream so that said data stream is not further amplified by said second gain stage;
detecting when the voltage of the output of said first gain stage crosses a predetermined threshold; and
activating said second gain stage when the output of said first gain stage crosses said predetermined threshold voltage so as to amplify said data stream as amplified by said first gain stage.

* * * * *